US006310701B1

(12) United States Patent
Lizotte (10) Patent No.: US 6,310,701 B1
(45) Date of Patent: Oct. 30, 2001

(54) METHOD AND APPARATUS FOR ABLATING HIGH-DENSITY ARRAY OF VIAS OR INDENTATION IN SURFACE OF OBJECT (75) Inventor: Todd E. Lizotte, Manchester, NH (US)

(73) Assignee: Nanovia LP, Londonderry, NH (US)

( * ) Notice: Subject to any disclaimer, the term of this patent is extended or adjusted under 35 U.S.C. 154(b) by 0 days.

(21) Appl. No.: 09/514,084

(22) Filed: Feb. 28, 2000

Related U.S. Application Data (60) Provisional application No. 60/158,478, filed on Oct. 8, 1999.

(51) Int. Cl.$^7$ ..................................................... G02B 5/32

(52) U.S. Cl. ......................... 359/15; 359/17; 219/121.68; 219/121.69; 219/121.7; 219/121.82; 264/400; 216/17

(58) Field of Search ................................ 359/15, 17, 202, 359/214; 219/121.61, 121.7, 121.74, 121.75, 121.76, 121.77, 121.82, 121.68, 121.69; 264/400; 216/17, 65

(56) References Cited

U.S. PATENT DOCUMENTS

| 4,326,824 | | 4/1982 | Lasermann et al. . |
| 4,348,253 | | 9/1982 | Subbarao et al. . |
| 4,473,737 | | 9/1984 | Anthony . |
| 4,532,402 | | 7/1985 | Overbeck . |
| 4,681,452 | | 7/1987 | Watanabe . |
| 4,959,119 | | 9/1990 | Lantzer . |
| 5,108,785 | | 4/1992 | Lincoln et al. . |
| 5,126,648 | | 6/1992 | Jacobs . |
| 5,293,025 | * | 3/1994 | Wang ............................ 219/121.71 |
| 5,481,407 | * | 1/1996 | Smith et al. ...................... 359/742 |
| 5,509,553 | * | 4/1996 | Hunter, Jr. et al. ................. 216/13 |
| 5,523,543 | * | 6/1996 | Hunter, Jr. et al. ............ 219/121.69 |
| 5,552,574 | * | 9/1996 | Merlin ............................ 219/121.69 |
| 5,571,429 | * | 11/1996 | Smith et al. .................... 219/121.68 |
| 5,593,606 | | 1/1997 | Owen et al. . |
| 5,614,114 | | 3/1997 | Owen . |
| 5,633,735 | * | 5/1997 | Hunter, Jr. et al. ..................... 359/15 |
| 5,702,662 | * | 12/1997 | Smith et al. .......................... 264/400 |
| 5,737,122 | | 4/1998 | Wilt et al. . |
| 5,808,272 | | 9/1998 | Sun et al. . |
| 5,841,099 | | 11/1998 | Owen et al. . |
| 5,847,960 | | 12/1998 | Cutler et al. . |
| 5,894,530 | | 4/1999 | Wilt . |
| 5,920,973 | | 7/1999 | Kosmowski . |
| 5,984,079 | | 11/1999 | Garcia . |
| 5,990,444 | * | 11/1999 | Costin ............................. 219/121.69 |
| 5,997,223 | | 12/1999 | Kosmowski . |

OTHER PUBLICATIONS

N.A. Vainos et al., "Excimer laser use for microetching computer–generated holographic structures", Applied Optics, 35(320, pp. 6304–6319, Nov. 1996.*

* cited by examiner

Primary Examiner—Cassandra Spyrou
Assistant Examiner—Leo Boutsikaris
(74) Attorney, Agent, or Firm—Davis & Bujold, P.L.L.C.

(57) ABSTRACT

An apparatus and process for ablating an array matrix of high-density vias in a flexible and rigid desired object. The apparatus contains a mirror based x, y scanning repeat positioning and/or a single axis scanner positioning system that directs a single point of a coherent light radiation beam at desired individual mask segments. These mask segments are formed into a planar mask array. A flat field collimating lens system is positioned between the mirror scanning system and the mask arrays to correct the angular beam output of the repeat positioning mirror and redirects the beam so that it strikes a specific rear surface segment(s) of in the mask array. The flat field collimating lens provides a beam that either illuminates the mask perpendicular to its surface or at preselected optimized illumination angles. Once illuminated, the specific segment of the mask array images and processes a single or a plurality of desired holes or features in a top surface of a flexible or rigid desired object to be processed.

18 Claims, 6 Drawing Sheets

… no

METHOD AND APPARATUS FOR ABLATING HIGH-DENSITY ARRAY OF VIAS OR INDENTATION IN SURFACE OF OBJECT

This application claims benefit of Provisional No. 60/158,478 filed Oct. 8, 1999.

FIELD OF THE INVENTION

The present invention relates to a system for burning, drilling, or otherwise forming one or more desired vias, blind vias or other surface indentations, indicia, markings and/or formations in a surface of a desired object, such as a substrate.

BACKGROUND OF THE INVENTION

There are currently available a variety of systems for forming a hole, a via, a blind via or some other surface indentation in an exterior surface of an object, but many of these systems are very expensive to purchase and operate at relatively slow production rates. The present invention seeks to overcome the above noted drawbacks of the prior art by providing a system which is relatively inexpensive to purchase and maintain while, at the same time, operates at increased production speeds so that the desired vias, blind vias, or other surface indentations, apertures or markings can be achieved in a surface of a desired object during a shorter period of production time.

SUMMARY OF THE INVENTION

It is the object of the present invention to provide a method and apparatus for ablating a desired high-density array or pattern of vias or other surface indentations or formations in a surface of an object to be processed.

Another object of the invention is to facilitate use of a variety of different lasers which operate at different wavelengths and pulse durations, to minimize the associated costs in connection with ablating a high-density array of blind vias, vias or other surface indentations or formations in a surface of an object to be processed. It is to be appreciated that an ultraviolet, a visual, an infrared as well as other types of lasers, extending across the entire spectrum, could be utilized in accordance with the teaching of the present invention.

Yet another object of the present invention is to provide a method and apparatus which allows the number of vias or other indentations or formations, to be formed in a surface of an object being processed, to be easily varied during production of the same by control of a substantially collimated beam emanating from the laser.

Still another object of the invention is to provide an apparatus which is relatively less inexpensive to purchase and operate, in comparison to other known systems, while still improving the production rates of the objects to be processed.

BRIEF DESCRIPTION OF THE DRAWINGS

The invention will now be described, by way of example, with reference to the accompanying drawings in which.

DESCRIPTION OF THE PREFERRED EMBODIMENTS

Figure 1:
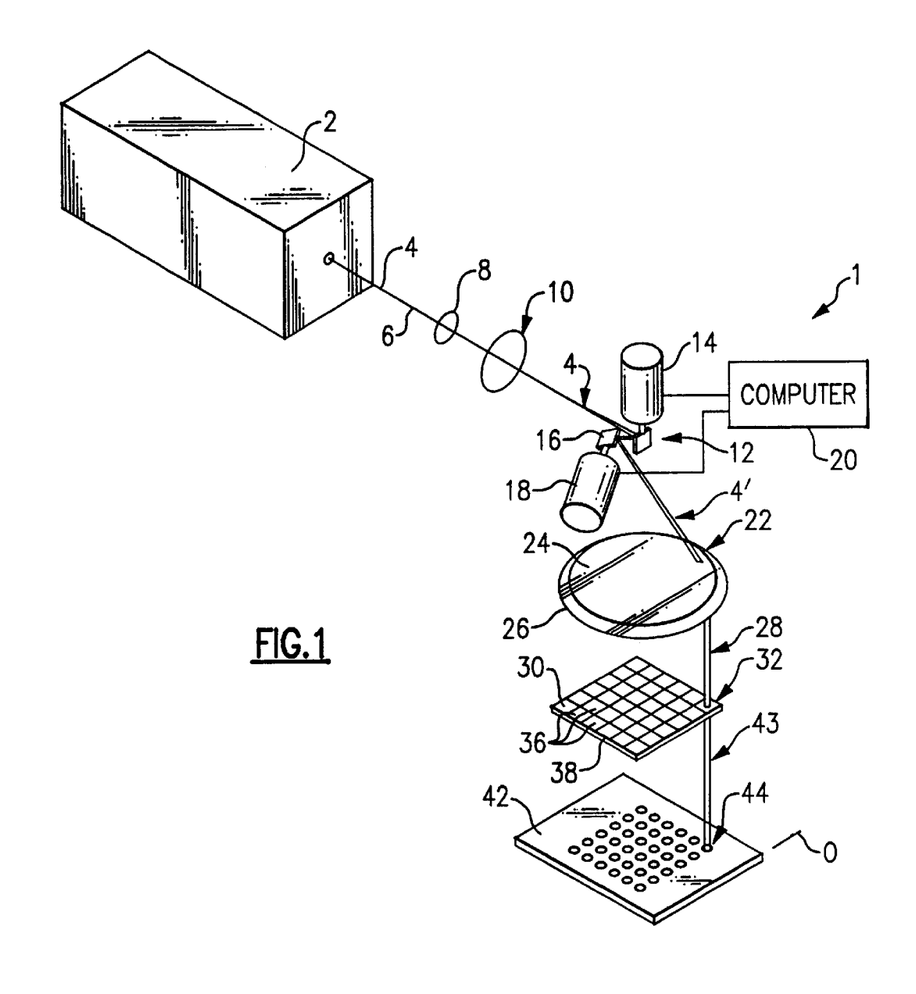
FIG. 1 is a perspective view diagrammatically showing the entire system of the Present invention.

Turning now to FIG. 1–4, a detailed description of the present invention will now be provided. As can be seen in FIG. 1, a conventional laser 2 (only diagrammatically shown in this Figure) is employed for generating and outputting a laser beam 4. It is to be appreciated that the laser 2 can be either excimer or non-excimer laser and further details and operating parameters for the preferred laser, for use with the present invention, will be provided below. The laser beam 4, generated by the laser 2, is either an ultraviolet, a visible, an infrared, a coherent radiation beam or some other light radiation beam 4 which is supplied along a laser axis 6 toward at least a first expansion telescope or expansion lens 8 and also preferably then supplied to a second expansion telescope or expansion lens 10. The purpose of the expansion telescope or lens 8 and/or 10 is/are to suitably expand the diameter of the generated ultraviolet, visible, infrared or other light radiation laser beam 4 so as to have a desired resulting laser diameter. As such expansion feature and teaching is conventional and well known in the art, a further detail discussion concerning the same is not provided.

The expanded ultraviolet, visible, infrared or other light radiation beam 4 is then directed, along the laser axis 6, at a first reflective mirror 12 of an X-axis automated repeat positioner 14 of the system 1. The first reflective mirror 12 of the X-axis automated repeat positioner 14 controls the X-coordinate, along the surface of the object to be processed 0, at which the ultraviolet, visible, infrared or other light radiation laser beam 4 will be reflected. The first reflective mirror 12 suitably redirects or alters the path of the ultraviolet, visible, infrared or other light radiation laser beam 4 and then reflects the beam toward a second reflective mirror 16, controlled by a Y-axis automated repeat positioner 18 of the system 1. The second reflective mirror 16, associated with the Y-axis automated repeat positioner 18, controls the Y-coordinate, along the surface 42 of the object to be processed 0, at which the ultraviolet, visible, infrared or other light radiation laser beam 4 will be reflected. The second reflective mirror 16 suitably redirects or alters the path of the ultraviolet, visible, infrared or other light radiation laser beam 4 and then reflects the alter beam toward a rear surface 24 of a flat field collimating lens or some other refractive, diffractive or holographic component 22 (hereafter referred to as a "collimating component"), which is well known in this art. Both the X-axls automated repeat positioner 14 and the Y-axis automated repeat positioner 18 are coupled to a computer controller 20 which controls the reflective positions of the first and second reflective mirrors 12 and 16, to suitably reflect and/or redirect the ultraviolet, visible, infrared or other light radiation laser beam at a desired location on the rear surface 24 of the field collimating lens or holographic component 22. As such automated control feature of the X-axis and the Y-axis automated repeat positioners 14 and 18 is well known in the art, a further detail discussion concerning the same is not provided.

A suitable X-axis automated repeat positioner or a Y-axis automated repeat positioner 14 or 18 is sold by Cambridge Technology, of Cambridge, Mass., as part no. 6870M Optical Scanner Heads. It is to be appreciated that other currently available scanners or repeat positioners, which facilitate accurate reflecting and/or redirecting of a laser beam, at a desired location of an X, Y coordinate system, could also be employed with the teaching of the present invention.

The reflected ultraviolet, visible, infrared or other light radiation laser beam 4' enters the rear surface 24 of the field collimating lens or other holographic component 22, passes therethrough and is suitably altered in a conventional manner by the field collimating lens or other holographic component 22 so that the ultraviolet, visible, infrared or other light radiation laser beam which is emitted from the front surface 26 of the field collimating lens or other holographic component 22 is a substantially collimated beam 28. This substantially collimated beam 28 is redirected, by the field collimating lens or other holographic component 22, toward a desired area or portion of a rear surface 30 of a holographic Imaging lens 32 (or some other imaging element such as a holographic element, a diffractive element and a binary mask element) and strikes that desired area or portion. The holographic imaging lens 32 is designed such that as the light enters by way of the rear surface 30 of one of the holographic imaging segments 36, the light will be focused, by that holographic imaging segment 36 of the holographic imaging lens 32, at a desired location or locations along a top surface 42 of the object to be processed O. The object to be processed O is located at a desired working distance D, for example, between 5 mm and 1000 mm, and preferably between about 200 to 300 mm from the holographic imaging lens 32,. The altered light is emitted from the front surface 38 of the holographic imaging lens 32 as focused light beam 43.

This focused light beam 43 is directed at a desired location(s) along the top or other desired surface 42 of the object to be processed for drilling, burning or otherwise forming a desired blind via(s), aperture(s), opening(s), indicia, indentation(s) or other surface formation(s) 44 therein of a desired size and depth. The size of the formation (s) 44 is determined and/or defined by the design characteristics of the holographic imaging segment 36 of the holographic imagining lens 32. In addition, the depth of the formation(s) 42 is a direct function of the duration or amount of pulses of the laser 2 emitted at the top surface 42 of the object to be processed. That is, the longer the duration or greater of the number of pulses of the laser 2, the greater the depth of the formation(s) 44 in the object to be precessed O, while the shorter the duration or the smaller the number of pulses from the laser 2, the smaller the depth of the formation(s) 44 in the object to be precessed O. As diagrammatically shown in FIGS. 1 and 2, the focused laser beam 43 is shown drilling, burning or otherwise forming a desired formation(s) 42, such as a blind via, in the top surface of the object to be processed O.

An important distinction between the present invention and the prior art is that X-axis and the Y-axis automated repeat positioner 14, 18 are particularly adapted to redeflecting the laser beam at only selected or desired rear areas of the holographic imaging lens 32. As is conventionally done in the prior art, scanners are used to scan the laser beam across the entire rear surface of the holographic imaging lens, not only at a selected area or areas.

Figure 3:
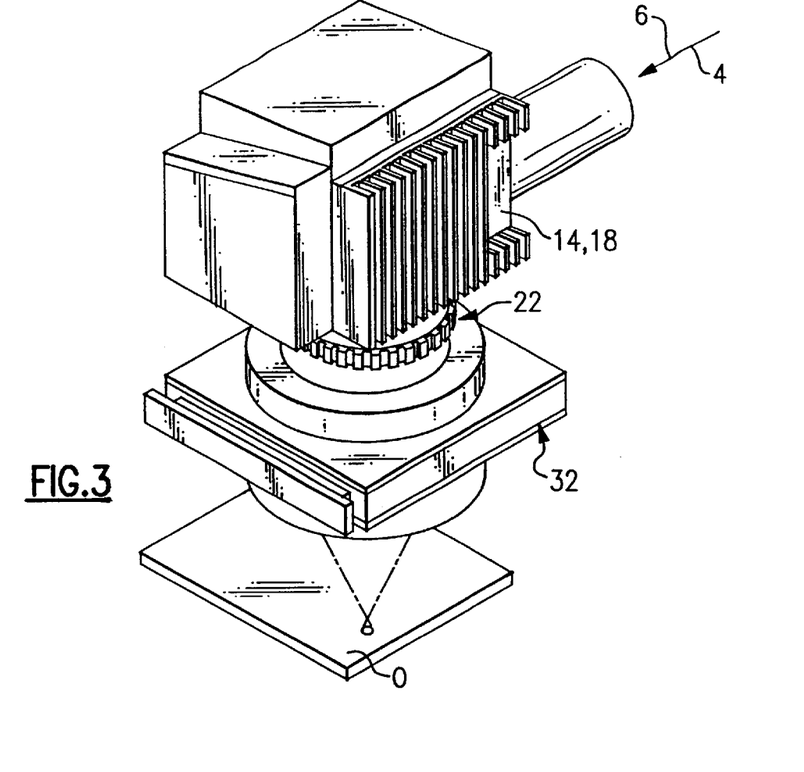
FIG. 3 is a diagrammatic representation showing an X-axis and Y-axis automated repeat positioner, a collimating lens and a holographic lens which are combined as a single unit for use as the laser imaging system of the present invention

With reference to FIG. 3, a combined X-axis, Y-axis automated repeat ipositioner, collimating lens and holographic unit can be seen. The X and Y-axis automated repeat positioners are generally designated as 14, 18, the collimating lens or other holographic component 22 is located beneath the automated positioners and the holographic imaging lens 32 is located to receive the collimated light from the collimating lens or other holographic component 22. The arrangement results in a compact design for the main components of the imaging system 1 of the present invention.

Figure 2:
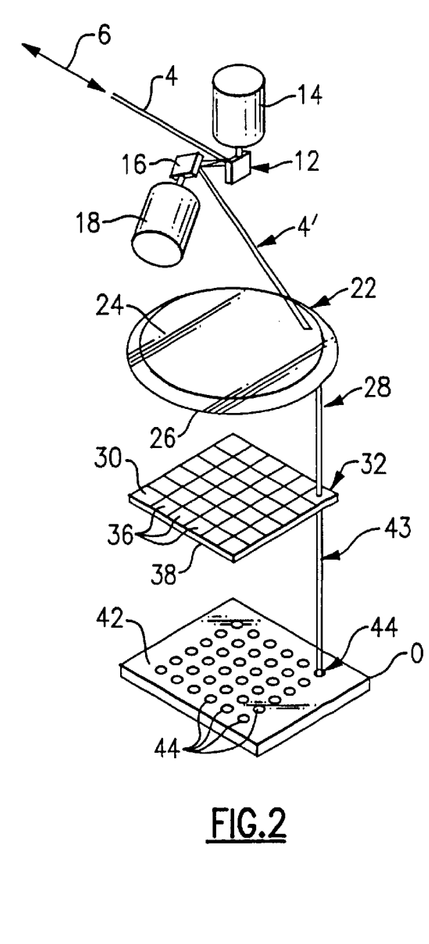
FIG. 2 is an enlarged perspective diagrammatic view of FIG. 1 showing the laser imaging system according to the present invention.
Figure 4:
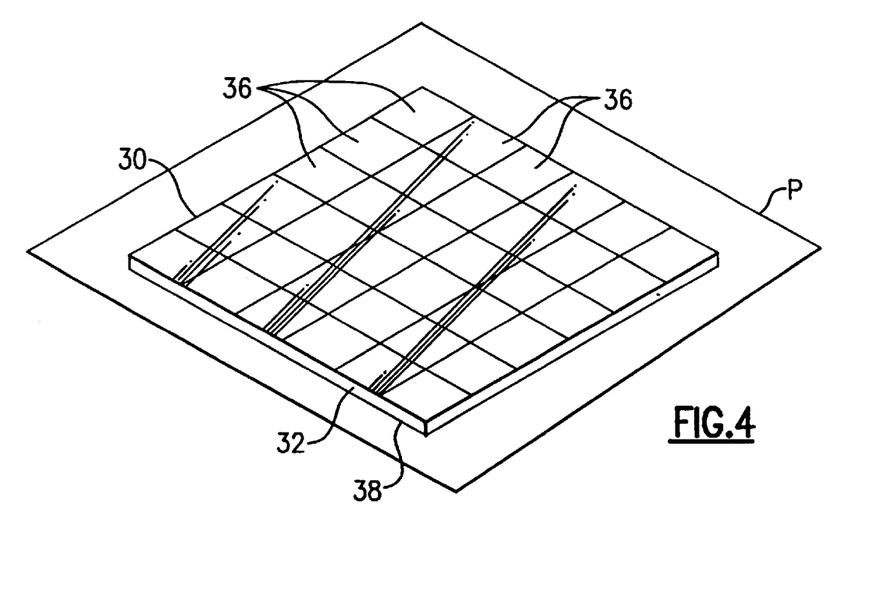
FIG. 4 is a perspective view diagrammatically showing a mask for use with the laser imaging system of the present invention.

As can be seen in further detail in FIG. 4, the holographic imaging lens 32, according to the present invention, is partitioned into a plurality of desired holographic imaging segments 36 and each holographic imaging segment 36 is designed to form, burn or drill at least one desired size via, blind via, hole, aperture, indicia, indentation, feature or other formation 44 in the top surface 42 of the object to be processed O. The holographic imaging lens 32, as shown in FIGS. 1, 2 and 4, is partitioned into thirty-six (36) different holographic imaging segment 36 and each segment 36 is designed to form, according to the first embodiment, a corresponding blind via or other formation(s) or feature(s) 44 in the top surface of the object to be processed O.

It is to be appreciated that the number of holographic imaging segments 36, being incorporated into the holographic imaging lens 32, can vary from application to application. Further, the number of holes, apertures, vias, or other formation(s) or feature(s) 44, to be formed by each holographic imaging segment 36, can be changed from application to application. Accordingly, the holographic imaging lens 32, according to the present invention, can be designed to drill, form or otherwise burn only a few or many tens of thousands of formation(s) or feature(s) 44 in the desired object to be processed O. The important feature, according to the present invention, is that all the holographic imaging segments 36 are arranged and located closely adjacent one another so as to all lie in the same plane P which plane extends parallel to the top surface 42 of the object to be processed.

The holographic segments 36 are either glued or otherwise are affixed to one another, in a conventional manner or a perimeter retaining ring or member encases and maintains the holographic segments in their close adjacent planar relationship. Alternatively, the holographic imaging lens can be formed from a single unitary piece of material and each holographic segment can be designed to form the desired hole(s), aperture(s), via(s), or other formation(s) or feature (s) 44.

According to the present invention, the X-axis and the Y-axis automated repeat positioners 14 and 18 are controlled by the computer 20, or other automated system to select the desired area or portion of the rear surface 24 of the field collimating lens or other holographic component 22 to be illuminated by the substantially collimated beam 28. The substantially collimated beam 28 passes through the field collimating lens or other holographic component 22 and emanates from a front surface 26 thereof toward the rear surface of a desired one of the holographic imaging segments 36 of the holographic imaging lens 32. The substantially collimated beam 28 strikes a desired area or portion, within the holographic imaging segment 36, and the substantially collimated beam 28 is focused, in a conventional manner, by the holographic imaging segment 36 to result in a focused beam 43 which drills, burns, or forms the desired hole(s), aperture(s) or other formation(s) 44 in the top surface 42 of the object to be processed O.

The holographic imaging lens 32, which comprises a plurality of holographic imaging segments 36, can be obtained from a variety of sources such as, for example, Diffraction Ltd. of Waitsfield, Vt., Digital Optics Corporation, of Charlotte, N.C., MEMS Optical, LLC. of Huntsville, Ala. and Rochester Photonics Corp. of Rochester, N.Y.

It is to be appreciated that if a total of thirty-six (36) holes or formations 44 were to be formed in the top surface 42 of the object to be processed O, as shown in FIGS. 1 and 2, each one of the holographic imaging segments 36 of the holographic imaging lens 32 would be designed to form a single hole or formation 44 and be sequentially illuminated with the substantially collimated beam 28 in a desired sequential order for a desired number of pulses or a desired pulse duration. Alternatively, if only some holes or formations 44 are required to be burned, drilled or formed in the top surface 42 of the object to be processed O, but other holes or formations 44 are not required, only the holographic imaging segments 36 which are designed to form the desired holes or formations 44 in the top surface 42 of the substrate to be processed 0 are illuminated with the substantially collimated beam 28 while the holographic imaging segments 36, which would form the unwanted holes or formations 44 in the top surface of the substrate to be processed O, are not illuminated with the substantially collimated beam 28.

The holographic imaging lens 32, as can be seen in FIG. 4, essentially comprises a plurality of separate holographic imaging lens or segments 36 which are all located closely adjacent one another, in a desired orientation and all lying substantially in the same plane P to form a continuous unitary component. This arrangement facilitates a compact design of the holographic imaging lens 32 and allows the system to selectively and readily control which holographic imaging segments 36, of the holographic imaging lens 32, are activated during production of a desired substrate or object to be processed O via appropriate control of the X-axis and the Y-axis automated repeat positioners 14 and 18. Such construction provides the system, according to the present invention, with greater flexibility and allows variation in the amount and location of the holes or formations 44 to be formed, burnt or drilled in the top surface 42 of object to be processed O during commercial production of the same.

Figure 5:
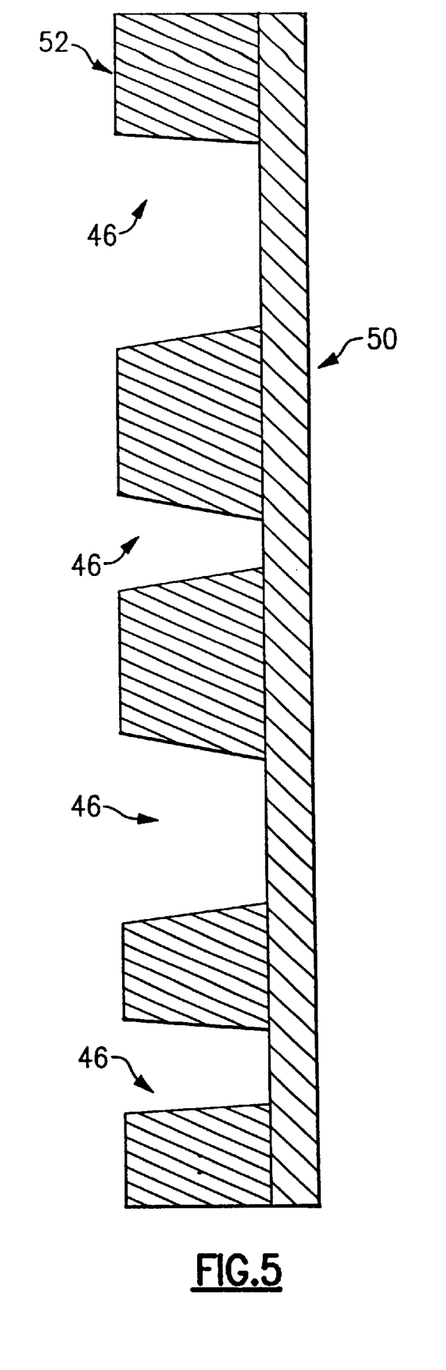
FIG. 5 is a diagrammatic transverse cross-sectional view of substrate having a plurality of different sizes blind vias formed therein by the laser imaging system of the present invention.

With reference to FIG. 5, an example of an object to be processed O can be seen. As shown in this Figure, the object to be processed O contains a base layer 50 which comprises a standard metal such as aluminum, copper, gold, molybdenum, nickel, palladium, platinum, silver, titanium, tungsten, metal nitrides or a combination(s) thereof. The thickness of the metal base layer 50 may vary but typically ranges between about 9 to about 36 $\mu$m and may be as thick as about 70 $\mu$m. The top layer 52 comprises a standard organic dielectric materials as BT, cardboard, cyanates esters, epoxies, phenolics, polyimides, PTFE, various polymer alloys, or combinations thereof. The thickness of the top layer 52 is generally thicker than the base layer 50 and typically ranges between about 50 to about 200 $\mu$m.

Figure 6:
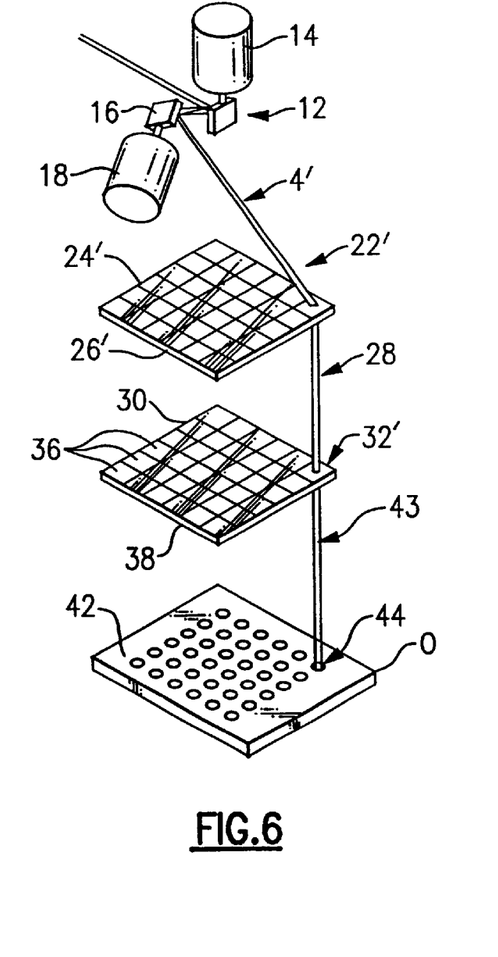
FIG. 6 is a diagrammatic perspective view of a second embodiment of the laser imaging system of the present invention.

As can be seen in FIG. 5, a plurality of blind vias 46 are formed therein and the blind vias can have different diameters. The diameter of the blind vias 46 are determined by the focusing characteristics of the holographic imaging lens 32, e.g. the holographic imaging lens focuses the supplied collimated light beam 28 over a wider area to achieve larger diameter blind via and focuses the light over a narrower area to achieve narrower diameter blind via. In both applications, it is to be appreciated that the duration or number of pulses are controlled by the system 1 to insure that the entire top layer 52 of the object to be processed O is obliterated thereby exposing the underlying metal base layer 50 while being of a substantially short enough intensity and duration so as not to in any way destroy or obliterate the underlying base layer 50. it is to be appreciated that a variation of the holographic imaging lens, as shown in FIG. 6, can be substituted in place of the field collimating lens 22. If a collimating holographic imaging lens 32' is employed as the field collimating lens, then the holographic imaging lens 32' is designed so as to receive light from the X-axis and the Y-axis automated repeat positioners 14 and 18 and redirect the supplied ultraviolet, visible, infrared or other light radiation laser beam 4, as a substantially collimated beam 28, at a desired rear surface of one of the holographic imaging segments 36 of the holographic imaging lens 32'. The holographic imagining lens 32' is designed to collimate the supplied light beam and redirect the beam 4' light toward the holographic imagining lens 32' so that the substantially collimated beam 28 enters the rear surface of the holographic imagining lens 32' at an angle of about of between about 0° to about 90° or some other predetermined angle depending upon the design parameters of the imaging system 1.

The inventor has appreciated that if the substantially collimated beam 28, supplied by the field collimating lens or other holographic component 22, is redirected at the rear surface of the holographic imaging lens 32' at an angle of about 45° or so, the efficiency of the holographic imaging lens 32' is significantly increased over the efficiency when the substantially collimated beam 28 is redirected at the rear surface of the holographic imaging lens 32' at an angle of about 90°. That is, the efficiency of the holographic imaging lens 32' is less when the substantially collimated beam 28 enters the rear surface of the holographic imaging lens 32' at an angle of about 90° while the efficiency increases if the substantially collimated beam 28 enters the rear surface of the holographic imaging lens 32' at a suitable angle of about between 0° and 90°. Accordingly, the desired angle in which the substantially collimated beam 28 enters the rear surface of the holographic imagining lens 32' can vary, from application to application, and can be determined by trial and error depending upon the parameters of the imaging system 1. Therefore, by using a holographic imaging lens 32' as the field collimating lens 22, the overall efficiency of this system can be increased without changing or modifying any of the other system requirements or parameters.

Figure 7:
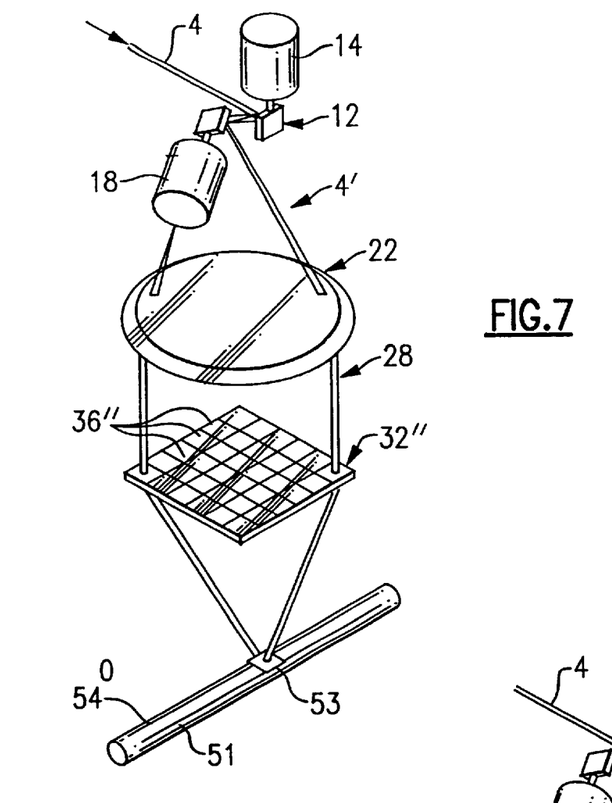
FIG. 7 is a diagrammatic perspective view of a third embodiment the laser imaging system, according to the present invention, for forming indicia on either a stationary or a moving object to facilitate use of the laser imaging system as a typewriter.

Turning now to FIG. 7, the holographic imaging lens 32 can be designed to result essentially in a keyboard 32", e.g.

there can be twenty-six (26) holographic imaging segments 36" with each holographic segment being designed to form, burn or drill one letter of the alphabet, ten (10) additional holographic imaging segments 36" with each holographic segment being designed to form, burn or drill one number zero through 9, a further plurality of holographic imaging segments 36" with each additional holographic segment being designed to form, burn or drill desired punctuation, indicia, etc. By operation of the laser (not shown in this Figure) and adequately controlling of the X-axis and the Y-axis automated repeat positioners 14, 18, via the computer 20, the ultraviolet, visible, infrared or other light radiation laser beam 4 can be collimated and supplied at a rear surface of a desired one of the holographic imaging segments 36" of the keyboard holographic imaging lens 32" to type, drill or form a desired letter, numeral, indicia, etc. in a top surface of an object to be processed, e.g. a cable or wire 50 running at high speed which is to have a desired marking form thereon such as "A 0903 C".

According to this embodiment, each image or other indicia to be formed by the keyboard holographic imaging lens 32" is focused to form the desired indicia at the same area or "printing location" 52 so that during operation of the system 1, as a cable or wire 50, for example, moves past that "printing location" 52, the X-axis and the Y-axis automated repeat positioners 14, 18 are controlled by the computer 20 to select the desired holographic imaging segment 36 so as to type, burn, drill or form a desired indicia, character, numeral, etc., in an exterior surface 54 of the wire 50 or other object as it moves past the "printing location" 52. It is to be appreciated that the system, according to the present invention, incorporating the keyboard holographic imaging lens 32" operates at a very high speed such that the desired indicia, character, numeral, etc. are essential printed in sequential order one after the other to result in a desired pattern, e.g. "A 0903 C".

Instead of using alphanumeric characters for the keyboard, each segment 36" can be provided with suitable light altering information for forming a bar code or other desired marking indicia on a surface of an object as it moves relative to the system or remain stationary at the "printing location" 52. As such teaching is conventional and well known to those skilled in the art, a further detailed description concerning the same will not be provided.

The above described embodiment is particularly useful for marking alpha-numeric characters at a rate that is approximately double the rate of any marking system currently available on the market. This system uses a specially designed segmented array mass to create the required surface marks, which may be, for example, bar codes, letters, numbers, punctuation marks, logos, foreign characters, etc. This segmented mass elements image every character in the array at the same locations so that the object or component, requiring the surface marking, is suitably moved or indexed relative to the image or printing location or zone so as to mark the desired alpha-numeric characters in the exterior surface of the object or component.

A further application of the marking system, according to the present invention, is to for use with marking different fiber materials with a code or code identifying or designating a specific production batch number(s), date(s), facility, and other assorted information that would be helpful to forensic investigators when investigating a crime scene or when explosives have been used. Such small fibers can be made from a host of materials such as Kevlar, carbon, glass, quartz, stainless steel, plastic, etc. The system, according to the present invention, will allow these fibers to be effectively mark at extremely low costs and at a high speed.

A further application is two-dimensional bar code marking at high speed. The system, according to the present invention, can be configured to provide high speed production marking of two-dimensional bar codes onto a either a stationary or a moving surface of a product or object. The system's segmented lens mass array can be used to image a series or group of associated indentations or surface markings that can be formed into a two-dimensional bar code or other indicia that can be read using standard optical character recognition software. This method of marking is similar to the way the present invention drills the holes of a nozzle array except the system will only sufficiently mark the top surface to form the desired two-dimensional bar code character or other indicia. It is to be appreciated that a plurality of closely arranged and aligned indentations or surface marks will comprise or form the each desired bar code, character, indicia, numeral, etc. The system offers an extremely high rate marking capability that is currently not available by known marking systems.

Figure 8:
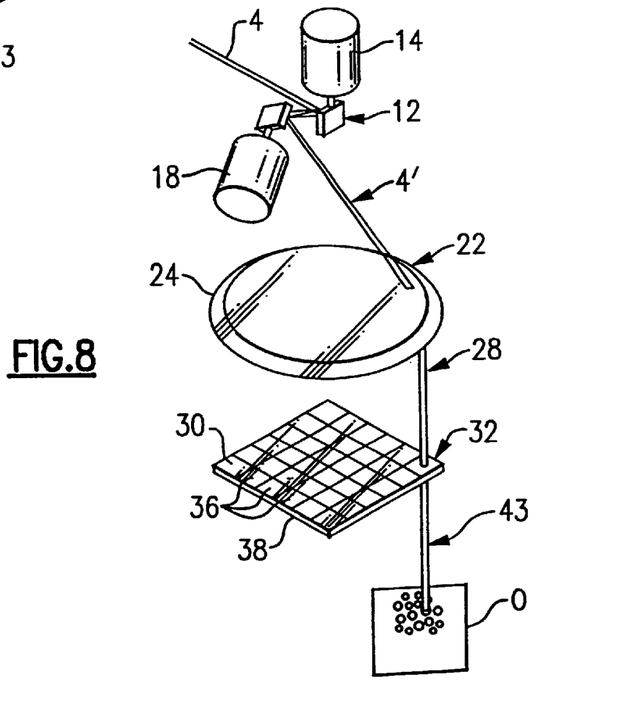
FIG. 8 is a diagrammatic perspective view of a fourth embodiment the laser imaging system, according to the present invention, for forming a desired nozzle array on a stationary object.

It is to be appreciated that the system of the present invention can be used to perforate a plurality of small orifices or holes (see FIG. 8), in a single or a multi-layered material, to enable the formation of a desired nozzle array for use in forcing a liquid (e.g. a perfumed, a solvent, a pharmaceutical, a chemical, etc.) there through to result in a desired spray configuration or pattern. The force fluid, upon exiting from the nozzle array, is atomized into small minute particles and dispersed in a desired spray configuration at a target. The system, according to the present invention, allows the formation of such orifices, nozzles, holes, etc., in a variety of different materials including, but not limited to, stainless steel, polyimide, lexan, brass, molybdenum, copper, aluminum, etc, for example.

The present invention is also well-suited for forming a set of miniature surface markings on an interior surface adjacent a breech end of a gun barrel of a firearm. In particular, the present system can be employed to form a desired unique bar code, matrix, an alpha numeric code, or any conventional identifying indicia on an inner surface adjacent the breech end of the gun barrel. Once the gun barrel is suitably marked with the identifying indicia, when the firearm is discharged in a conventional manner, the loaded gun shell expands, due to the gunpowder within the gun shell instantaneously igniting and heating the gun shell. This rapid expansion of the gun shell causes the exterior surface of the gun shell to be forced against the inwardly facing surface adjacent the breech end of the gun barrel such that the identifying indicia, formed on the inwardly facing surface of the breech end of the gun barrel, forms a matching impression or marking on the exterior surface of the gun shell. Upon discharge of the gun shell from the gun barrel, this matching impression or marking facilitates identifying which gun shell was discharged from which gun barrel. Such marking of the gun shell assists ballistics experts with confirm that a particular gun shell was discharged from a particular barrel of a firearm. If desired, a plurality of identical miniature surface markings can be formed, at spaced locations about the interior surface adjacent the breech end of a gun barrel of a firearm, to make in more difficult for an end user to located and completely remove all of such miniature surface markings from the interior surface of the breech end of the gun barrel so marked.

Suitable lasers for use with the present invention will now be briefly discussed. The present invention contemplates use of a variety of different lasers such as a slow flow CO2, CO2 TEA (transverse-electric-discharge), Impact CO2, and Nd:YAG, Nd:YLF, and Nd:YAP and Nd:YVO and Alexandrite lasers. In addition, it is to be appreciated that the system, according to the present invention, can utilize all other forms of lasers including gas discharge lasers, solid state flash lamp pumped lasers, solid state diode pumped lasers, ion gas lasers, and RF wave-guided lasers. The above noted lasers are currently available on the market from a variety of different manufacturers.

As used in the appended claims, the term "coherent light radiation source" is intended to cover ultraviolet, visible, infrared, and other types of known light radiation beams.

Figure 9:
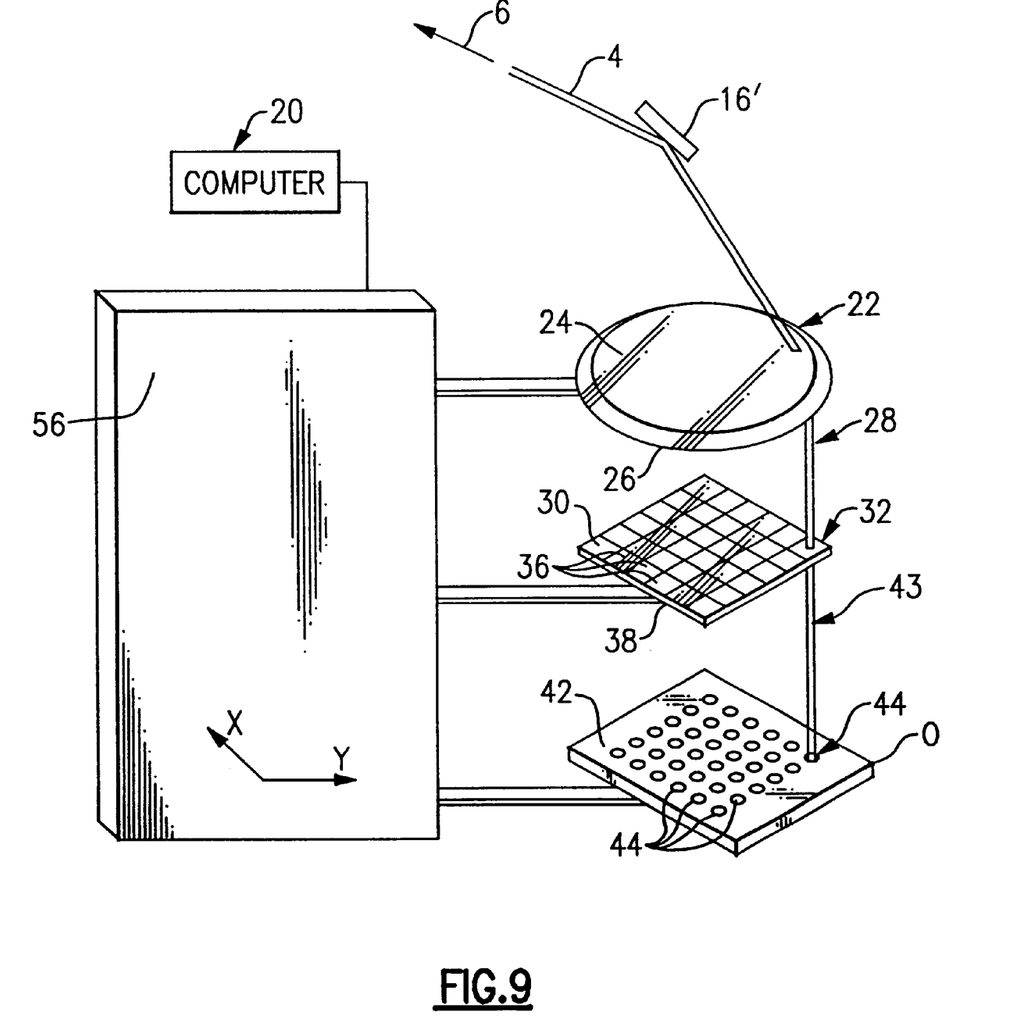
FIG. 9 is a diagrammatic perspective view of a fifth embodiment the laser imaging system, according to the present invention.
Figure 10:
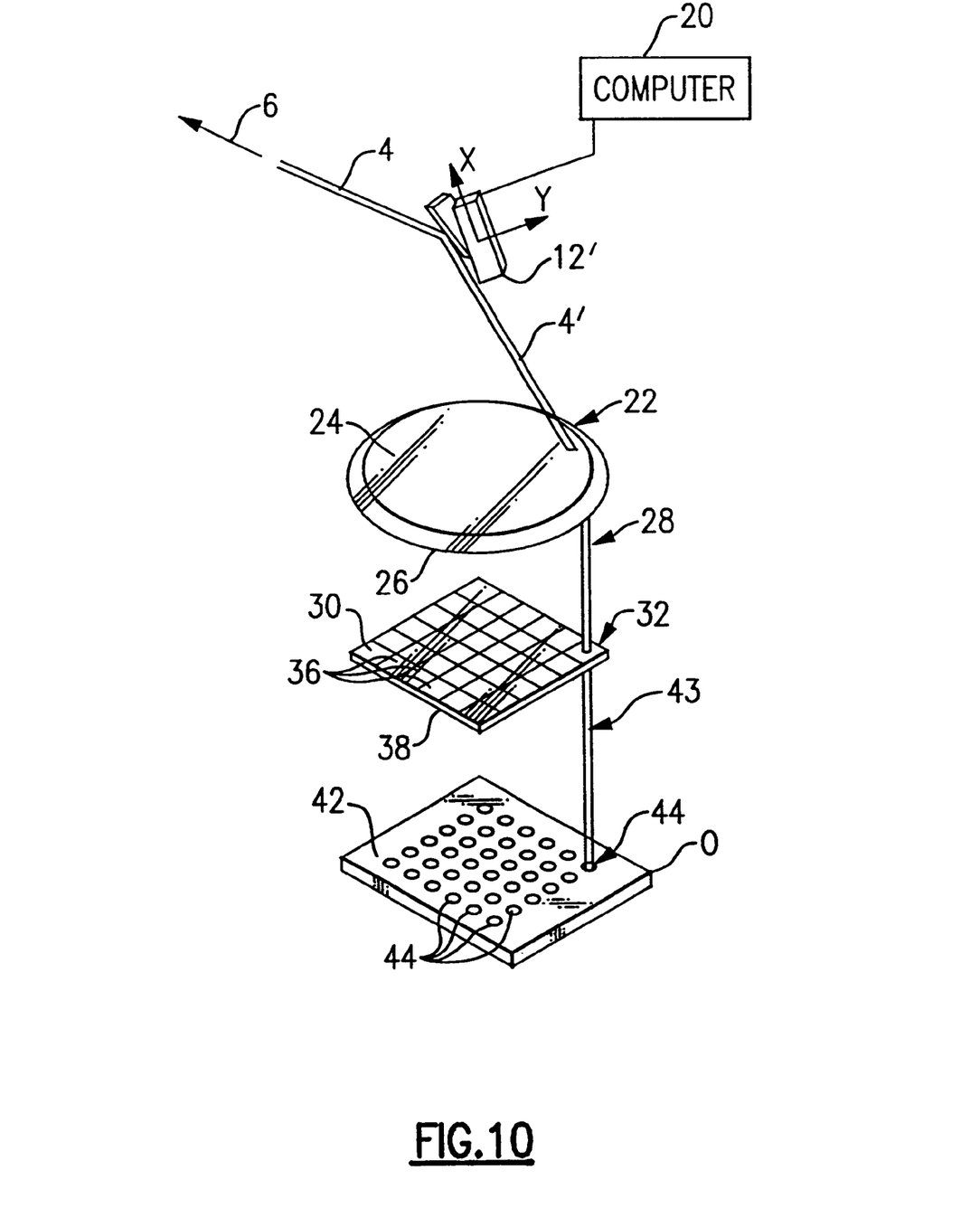
FIG. 10 is a diagrammatic perspective view of a fourth embodiment the laser imaging system, according to the present invention.

It is to be appreciated that a plurality of identical systems 1, similarly to the above described embodiments, can be simultaneously used to form, drill or burn a desired matrix of features in the same object to be processed. Further, it is to be appreciated that there are a variety of different arrangements that could be utilized to move the object to be processed O relative to the focused beam 43. For example, the object O, the field collimating lens other holographic component 22, and the holographic Imaging lens 32 can all be mounted on a mounting table 56 which is movable in the X-axis and the Y-axis directions and coupled to the computer 20 for controlling movement of the table 56 relative to the focused beam 43 (FIG. 9). Alternatively, the X-axis Y-axis repeat positioner 14, 18 can be replaced with a single mirror mounted on a table 12' and movable in both the X- and Y-axis directions (FIG. 10). This table 12' is also coupled to the computer 20 and appropriately redirects the light beam to a desired rear surface of the field collimating lens other holographic component 22 to facilitate Illumination of a desired one of the holographic imaging segments 36. As such teaching in conventional and well known in the art, a further detailed description concerning the same is not provided.

Wherefore, I claim:

1. A process for ablating a matrix of features in a desired object, the process comprising the steps of:
    a) supplying non-collimated coherent light, from a radiation source, to illuminate a first reflective mirror;
    b) reflecting the supplied coherent light from the first reflective mirror to a rear surface of a desired area of a collimating component for collimating the supplied coherent light, with the collimating component comprising one of a collimating lens, a refractive component, a diffractive component and a holographic component;
    c) emitting collimated coherent light from a front surface of the collimating component to illuminate a desired imaging segment of an imaging element comprising one of a holographic element, a diffractive element and a binary mask element, the imaging element comprising a series of individual imaging segments which, when illuminated with a collimated coherent light, produce an image for ablating a corresponding feature in a desired object located at a working distance from the imaging element;
    d) providing a table for registering the desired object at the working distance from the imaging element; and repeating at least steps (a) through (c) a plurality of times to illuminate desired individual imaging segments of the imaging element with collimated coherent light from the radiation source to ablate the array matrix of features in the desired object.

2. The process for ablating a matrix of features according to claim 1, further comprising the step of forming the object to be ablated from a matallic base layer and a top layer which comprises an organic dielectric material.

3. The process for ablating a matrix of features according to claim 1, further comprising the step of forming the imaging element from a plurality of individual holographic mask segments with each of the plurality of individual holographic mask segments being combined together to form a single combined imaging element.

4. The process for ablating a matrix of features according to claim 1, further comprising the step of using a flat field collimating lens to supply substantially perpendicular illumination to a rear surface of the desired imaging segment of the imaging element.

5. The process for ablating a matrix of features according to claim 1, further comprising the step of providing a second reflective mirror, the first reflective mirror coupled to an X-axis repeat positioner for controlling a reflection of the coherent light beam along an X-coordinate and the second reflective mirror coupled to a Y-axis repeat positioner for controlling reflection of the coherent light beam along a Y-axis coordinate.

6. The process for ablating a matrix of features according to claim 1, further comprising the step of using one of a laser, an ultraviolet laser, a visible laser, and an infrared laser as the radiation source.

7. The process for ablating a matrix of features according to claim 1, further comprising the step of providing at least one expansion lens for suitably expanding the coherent light beam to a desired diameter prior to illuminating the first reflective mirror.

8. The process for ablating a matrix of features according to claim 7, further comprising the step of using one of an ultraviolet coherent light beam, an invisible coherent light beam, a coherent radiation light beam and an infrared light beam as the coherent light.

9. The process for ablating a matrix of features according to claim 5, further comprising the step of using a computer to control operation of at least one of the radiation source, the X-axis repeat positioner, the Y-axis repeat positioner, and the table for registering the desired object.

10. The process for ablating a matrix of features according to claim 1, further comprising the step of spacing a bottom surface of the imaging element from a top surface of the desired object by a distance of between 5 mm and 1,000 mm.

11. The process for ablating a matrix of features according to claim 5, further comprising the step of forming the X-axis and Y-axis repeat positioners, the collimating component and the imaging element with one another as a single unit.

12. The process for ablating a matrix of features according to claim 1, further comprising the step of locating the individual imaging segments closely adjacent to one another in a planar relationship to form an integral array.

13. The process for ablating a matrix of features according to claim 1, further comprising the step of designing the imaging element as a holographic imaging keyboard with each holographic imaging segment of the holographic imaging keyboard forming a desired indicia in a surface of the desired object.

14. The process for ablating a matrix of features according to claim 1, further comprising the step of alternating a wavelength of the supplied coherent light, from the radiation source, to ablate the array matrix of features in the desired object.

15. The process for ablating a matrix of features according to claim 1, further comprising the step of varying a duration of the supplied coherent light from the radiation source to ablate the array matrix of features in the desired object.

16. The process for ablating a matrix of features according to claim 5, further comprising the step of mounting the collimating component, the imaging element and the table for registering the desired object to be movable in a X-axis direction and a Y-axis direction to a mounting table; and using a computer to control movement of the mounting table in the X-axis direction and the Y-axis direction for the collimating component, the imaging element and the table for registering the desired object.

17. A process for ablating an array of features in a desired object, the process comprising the steps of:

a) supplying non-collimated coherent light, from a radiation source, to illuminate at least one expansion lens for suitably expanding the non-collimated coherent light beam to a desired diameter;

b) directing the expanded non-collimated coherent light beam at sequentially arranged first and second reflective mirrors of an X and Y-axis repeat positioner;

c) reflecting the supplied non-collimated coherent light via the second reflective mirror of the X and Y-axis repeat positioner to a rear surface of a desired area of a collimating component for collimating the supplied non-collimated coherent light, the collimating component comprising one of a collimating lens, a refractive component, a diffractive component and a holographic component;

d) emitting collimated coherent light from a front surface of the collimating component to illuminate a desired imaging segment of an imaging element comprising one of a holographic element, a diffractive element and a binary mask element, the imaging element comprising a series of individual imaging segments which, when illuminated with a collimated coherent light, produce a single image for ablating a corresponding feature in a desired object located at a working distance from the imaging element;

e) providing a table for registering the desired object at the working distance from the imaging element; and repeating at least steps (a) through (d), a plurality of times, to illuminate desired individual imaging segments of the imaging element with collimated coherent light from the radiation source to ablate the array matrix of features in the desired object.

18. A process for ablating an array matrix of features in a desired object, the process comprising the steps of:

a) supplying non-collimated coherent light to illuminate a holographic component;

b) emitting collimated coherent light from a front surface of the holographic component to illuminate a desired imaging segment of one of a holographic element, a diffractive element and a binary mask element, comprising series of individual imaging segments which, when illuminated with a collimated coherent light, produce a signal image for ablating a corresponding feature in a desired object located at a working distance from the imaging element;

c) providing a table for registering the desired object at the working distance from the imaging element; and repeating steps (a) and (b) a plurality of times to illuminate desired individual imaging segments of the imaging element with collimated coherent light from the radiation source to ablate the array matrix of features in the desired object.

* * * * *